United States Patent
Denzinger et al.

(10) Patent No.: US 6,190,825 B1
(45) Date of Patent: Feb. 20, 2001

(54) POLYMERS CONTAINING N-SUBSTITUTED MALEIMIDE UNITS AND THEIR USE IN RADIATION-SENSITIVE MIXTURES

(75) Inventors: Steffen Denzinger, Mainz; Andreas Elsaesser, Idstein, both of (DE)

(73) Assignee: Agfa-Gevaert N.V., Morstel (BE)

( * ) Notice: Under 35 U.S.C. 154(b), the term of this patent shall be extended for 0 days.

(21) Appl. No.: 09/239,999

(22) Filed: Jan. 29, 1999

(30) Foreign Application Priority Data

Jan. 30, 1998 (DE) .............................................. 198 03 564

(51) Int. Cl.$^7$ .............................. G03F 7/023; G03F 7/30; C08F 222/40
(52) U.S. Cl. ........................ 430/192; 430/165; 430/193; 430/325; 430/326; 526/258; 526/262
(58) Field of Search ................... 526/258, 262; 430/192, 193, 165, 325, 326

(56) References Cited

U.S. PATENT DOCUMENTS

| | | | |
|---|---|---|---|
| 3,779,778 | 12/1973 | Smith et al. | 96/115 R |
| 3,869,292 | 3/1975 | Peters | 96/115 R |
| 4,132,715 | 1/1979 | Roth | 548/522 |
| 4,189,323 | 2/1980 | Buhr | 430/281.1 |
| 4,248,957 | 2/1981 | Sander et al. | 430/270.1 |
| 4,250,247 | 2/1981 | Sander et al. | 430/270.1 |
| 4,311,782 | 1/1982 | Buhr et al. | 430/270.1 |
| 4,540,762 | 9/1985 | Turner | 526/262 |
| 4,631,245 | 12/1986 | Pawlowski | 430/175 |
| 4,663,268 | 5/1987 | Turner | 430/270.1 |
| 4,678,737 | 7/1987 | Schneller et al. | 430/270.1 |
| 4,680,244 | 7/1987 | Lehmann et al. | 430/66 |
| 4,933,248 | 6/1990 | Lind et al. | 430/83 |
| 5,049,479 | 9/1991 | Zertani et al. | 430/271.1 |
| 5,068,163 | 11/1991 | Elsaesser et al. | 430/192 |
| 5,141,838 | 8/1992 | Aoshima | 430/191 |
| 5,143,816 | 9/1992 | Mizutani et al. | 430/192 |
| 5,576,137 | 11/1996 | Frass | 430/166 |
| 5,594,086 | 1/1997 | Vicari | 526/262 |
| 5,948,590 * | 9/1999 | Aoshima et al. | 430/270.1 |

FOREIGN PATENT DOCUMENTS

| | | |
|---|---|---|
| 2 306 248 | 9/1973 | (DE) . |
| 2 322 230 | 11/1973 | (DE) . |
| 27 15 435 | 10/1977 | (DE) . |
| 27 18 259 C2 | 11/1978 | (DE) . |
| 34 06 927 A1 | 8/1985 | (DE) . |
| 37 42 387 A1 | 6/1988 | (DE) . |
| 38 20 699 A1 | 12/1989 | (DE) . |
| 197 12 323.6 | 3/1997 | (DE) . |
| 197 39 302.0 | 9/1997 | (DE) . |
| 0 004 287 | 3/1979 | (EP) . |
| 0 006 626 | 1/1980 | (EP) . |
| 0 006 627 | 1/1980 | (EP) . |
| 0 022 571 | 1/1981 | (EP) . |
| 0 152 819 | 8/1985 | (EP) . |
| 0 157 241 | 10/1985 | (EP) . |
| 0 184 044 | 6/1986 | (EP) . |
| 0 187 517 | 7/1986 | (EP) . |
| 0 324 180 | 7/1989 | (EP) . |
| 0 364 735 | 4/1990 | (EP) . |
| 0 410 760 A3-A2 | 1/1991 | (EP) . |
| 0 330 239 | 8/1992 | (EP) . |
| 0 544 264 A1 | 6/1993 | (EP) . |
| 0 625 728 A2 | 11/1994 | (EP) . |
| 0 649 063 A1 | 4/1995 | (EP) . |
| 0 780 239 A2 | 6/1997 | (EP) . |
| 50 045076 | 4/1975 | (JP) . |
| 50-55406 | 5/1975 | (JP) . |
| 51-36129 | 3/1976 | (JP) . |
| WO 96/41841 | 12/1996 | (WO) . |

* cited by examiner

*Primary Examiner*—John S. Chu
(74) *Attorney, Agent, or Firm*—Foley & Lardner

(57) ABSTRACT

The invention relates to polymers containing N-substituted maleimide units, to a positive- or negative-working radiation-sensitive mixture comprising a) a polymeric binder which is insoluble in water, but soluble in aqueous-alkaline solutions, and b) at least one radiation-sensitive compound, where the binder comprises a polymer containing N-substituted maleimide units of the formula (I)

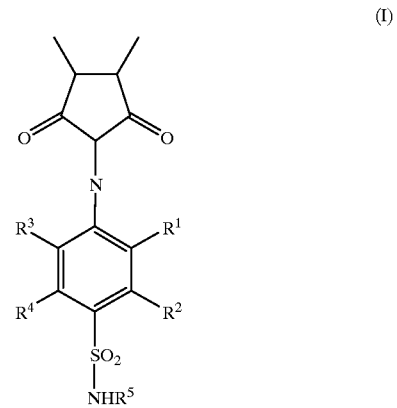

(I)

The invention furthermore relates to a recording material having a support and a radiation-sensitive layer, where the layer includes the mixture. The recording material is particularly suitable for the production of chemical-resistant relief recordings. The planographic printing plates produced from the recording material allow long print runs and are resistant to processing chemicals.

18 Claims, No Drawings

POLYMERS CONTAINING N-SUBSTITUTED MALEIMIDE UNITS AND THEIR USE IN RADIATION-SENSITIVE MIXTURES

BACKGROUND OF THE INVENTION

1) Field of the Invention

The invention relates to polymers and to a positive- or negative-working radiation-sensitive mixture including a binder which is insoluble in water, but soluble or at least swellable in aqueous-alkaline solution, and at least one radiation-sensitive compound. The invention furthermore relates to a recording material having a support and a radiation-sensitive layer, and to a process for the production of chemical-resistant relief recordings in which the recording material is exposed imagewise and then developed using an aqueous-alkaline solution.

2) Description of Related Art

Radiation-sensitive, positive- or negative-working mixtures which are fixed using aqueous-alkaline developers after irradiation are known and have been described for a variety of uses, for example, for the production of copying layers on planographic printing plates. The term "copying layer" is used here and below for a radiation-sensitive layer which has been exposed imagewise and developed, and possibly also baked.

The properties of such copying layers are determined essentially by the binder, in particular since it generally makes up the largest proportion of the total weight of all nonvolatile constituents of the radiation- or light-sensitive mixture. The binders used for positive copying layers are usually phenol-formaldehyde or cresol-formaldehyde condensation products of the novolak type, while negative copying layers based on diazonium salt polycondensates frequently use substituted polyvinyl butyrals. By contrast, layers based on photopolymers frequently use acrylate copolymers of suitable acidity.

However, the properties of the known positive and negative copying layers are not ideal for all applications. In planographic printing plates, the layer is in many cases insufficiently stable to achieve a long print run. In addition, the copying layers of the printing plates are frequently not sufficiently resistant to washing and cleaning media. In particular, in printing from positive copying layers using printing inks which harden in UV light, wash-out agents are used which have a high content of organic solvents (such as ethers, esters or ketones) or are even formulated entirely on the basis of organic solvents. The wash-out agents may cause considerable damage to the copying layer. If novolaks are present as binder, it is imperative to harden the copying layer thermally at temperatures above 200° C. before printing with the abovementioned inks or if a print run of greater than 100,000 prints is to be achieved.

Although negative copying layers based on diazonium polycondensates with polyvinylbutyral binders have significantly better stability to solvents than positive copying layers, the stability to isopropanol attack and similar damping solution additives is, however, usually inadequate. Furthermore, a comparatively high content of organic solvents is necessary in the developer in order to achieve satisfactory delamination.

In negative, photopolymer-based copying layers, the conventional binders are not hard enough to achieve optimum print run performance.

Various binders having an improved property profile have already been proposed. For example, alkali-soluble binders that have been described are phenolic resins based on naphthol, homopolymers and copolymers of vinyl-phenols (DE-A 23 22 230=U.S. Pat. No. 3,869,292, DE-A 34 06 927=U.S. Pat. No. 4,678,737), homopolymers and copolymers of hydroxyphenyl (meth)acrylates (JP-A 51 36129), dihydroxyphenyl (meth)acrylates, hydroxynaphthyl (meth)acrylates, hydroxybenzyl (meth)acrylates, hydroxyphenyl (meth)acrylamides (JP-A 50-55406), hydroxybenzyl(meth) acrylamides (DE-A 38 20 699=U.S. Pat. No. 5,068,163) or hydroxynaphthyl(meth)acrylamides, and copolymers of hydroxyphenylmaleimides (EP-A 0 187 517). Known alkali-soluble binders in radiation-sensitive mixtures also include homopolymers and copolymers containing halomethyl units and homopolymers and copolymers of monomers containing NH-acidic groups, for example, made from N-methacryl-sulfonamides (DE-A 37 42 387) or from sulfamoylphenyl (meth)acrylates or N-sulfamoylphenyl(meth) acrylamides (EP-A 0 330 239 and EP-A 0 544 264).

With the exception of the above polymers containing hydroxyphenylacrylamide units or with units containing NH-acidic groups, none of said binders has hitherto been used practically. The reasons for this are the poor development behavior, excessive developer consumption, impairment of the exposure contrast and complex preparation of the monomers. Binders containing hydroxyphenylacrylamide units are furthermore not sufficiently resistant to solvent-based cleaning agents and damping solutions. Binders containing NH-acidic groups are not sufficiently stable, even after thermal treatment, to allow a long print run.

SUMMARY OF THE INVENTION

One object of the invention is to overcome the disadvantages of the known art described above. Another object of the invention is to provide a polymer which can be used as binder in a radiation-sensitive mixture. The recording material produced therewith should have good processing properties. The resultant planographic printing plates should achieve long print runs and be resistant to cleaning chemicals.

In accomplishing the foregoing objects, there has been provided according to the present invention a polymer comprising units of the formula I

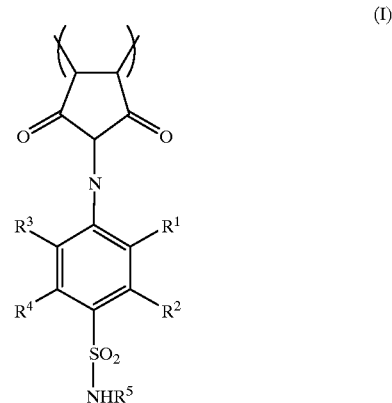

in which

R$^1$, R$^2$, R$^3$, and R$^4$ are identical or different and are selected from a hydrogen, a halogen atom, a hydroxyl, an alkoxy group, or an un-substituted or substituted alkyl or aryl group, and R$^5$ is selected from a hydrogen atom, an alkyl group, an alkanoyl group, a group of the formula C(=NH)—NHR$^1$, or an iso- or hetrocyclic, saturated or unsaturated, unsubstituted or substituted radical having 1 to 20 carbon atoms, which may be linked to one another to form a monocyclic or bicyclic ring system having at least 3 carbon atoms, wherein the thiazolyl radical is excluded.

According to another aspect of the invention, there has been provided a monomer of the formula:

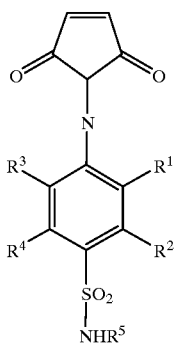

(II)

in which

R$^1$, R$^2$, R$^3$, R$^4$ and R$^5$ are defined as above.

According to another aspect of the invention, there has been provided a positive- or negative-working, radiation-sensitive mixture which comprises: a) a polymeric binder which is insoluble in water, but soluble or sellable in aqueous- alkaline solutions; and b) at least one radiation-sensitive compound, wherein the binder comprises a polymer as described above with R$^1$, R$^2$, R$^3$, and R$^4$ as defined above and R$^5$ is selected from a hydrogen atom, an alkyl group, an alkanoyl group, a group of the formula C(=NH)—NHR$^1$, or an iso- or heterocyclic, saturated or unsaturated, unsubstituted or substituted radical having 1 to 20 carbon atoms, which may be linked to one another to form a monocyclic or bicyclic ring system having at least 3 carbon atoms.

According to still another aspect of the invention, there has been provided a process for the production of chemical-resistant relief recordings, comprising: imagewise exposing a radiation-sensitive recording material as described above; and developing the exposed radiation-sensitive recording material with an aqueous-alkaline solution.

Further objects, features and advantages of the present invention will become apparent from the detailed description of preferred embodiments which follows.

DETAILED DESCRIPTION OF PREFERRED EMBODIMENTS

The present invention comprises a polymer which contains N-(4-sulfamoylphenyl)maleimide units. The invention accordingly relates to a homopolymer or copolymer containing units of the formula I

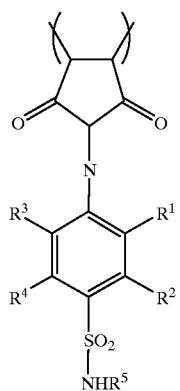

(I)

in which

R$^1$, R$^2$, R$^3$, and R$^4$ are identical or different and are a hydrogen or halogen atom, a hydroxyl, alkoxy, or an unsubstituted or substituted alkyl or aryl group, and R$^5$ is a hydrogen atom, an alkyl or alkanoyl group, a group of the formula C(=NH)—NH—R$^1$ or an iso- or heterocyclic, saturated or unsaturated, unsubstituted or substituted radical having 1 to 20 carbon atoms, wherein the thiazolyl radical is excluded.

The isocyclic or heterocyclic radicals R$^5$ may also contain a plurality (in general two to three) fused or unfused rings; however, particular preference is given to monocylic and bicyclic radicals. The heteroatoms in the heterocyclic radicals are preferably oxygen, sulfur and/or nitrogen atoms. Examples of heterocyclic radicals containing one ring are five-membered and six-membered rings with one or two nitrogen atoms and, optionally oxygen atoms, such as morpholin-2- and -3-yl, pyridin-2-, -3- and -4-yl and pyrimidin-2- and -4-yl. The substituents, which are only present optionally, in the alkyl and aryl radicals R$^1$ to R$^4$ are, in particular, halogen atoms (especially chlorine or bromine atoms) or hydroxyl groups, while the substituents in the iso- or heterocyclic radical R$^5$ are preferably halogen atoms or hydroxyl, amino, alkylamino, dialkylamino, alkoxy or alkyl groups.

In a preferred embodiment, R$^1$, R$^2$, R$^3$ and R$^4$ are hydrogen atoms or hydroxyl or alkyl groups, preferably (C$_1$–C$_{20}$) alkyl groups. R$^5$ is preferably a hydrogen atom, a (C$_2$–C$_7$) alkanoyl group, in particular an acetyl group, or a radical of a monocyclic heteroaromatic compound. R$^1$, R$^2$, R$^3$ and R$^4$ are particularly preferably hydrogen atoms or straight-chain or branched (C$_1$–C$_6$)alkyl groups, such as methyl, ethyl, propyl, isopropyl, butyl, isobutyl, sec-butyl, pentyl, 3-methylbutyl or hexyl groups.

The units of the formula I are derived from monomers of the formula II

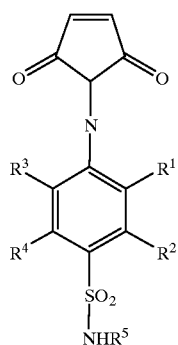

(II)

in which R$^1$ to R$^5$ are as defined above. The monomers are also novel and part of the present invention.

The N-substituted maleimides of the formula II can be prepared by relatively simple processes, for example analogously to the process described in WO 96/41841. In this process, a 4-aminobenzenesulfonamide is first reacted with maleic anhydride in solvents, such as N,N-dimethylformamide or N,N-di-methylacetamide, to give the corresponding maleimide acid. This maleimide acid is then converted into the N'-substituted N-(4-sulfamoylphenyl)-maleimide in a mixture of acetic anhydride and sodium acetate. The WO reference discloses hydrolysable polymers for use in antifouling coatings which can protect underwater surfaces against the growth of marine organisms. Although not individually disclosed, the WO reference contemplates, among a variety of other polymers, a polymer comprising units of N-(thiazolylsulfamoylphenyl)-maleimide (which may be also designated as 4-maleimido-N-thiazolyl-benzenesulfonamide) as an antifouling coating.

Besides units of the formula I, the polymers according to the invention can also contain units of one or more other monomers, which serve to adjust or match the properties of the polymer to specific requirements. Examples of "other monomers" are alkyl, aryl, or (hetero)aralkyl (meth) acrylates, such as methyl methacrylate, phenyl methacrylate, benzyl methacrylate, and furfuryl methacrylate, hydroxyl-containing esters of (meth)acrylic acid (such as hydroxyethyl (meth)acrylate), vinyl alkanoates or vinyl alkyl ethers (such as vinyl acetate or vinyl methyl ether), styrene or substituted styrenes (such as α-methylstyrene or vinyltoluene), (meth)acrylonitrile, unsubstituted or substituted (meth)acrylamide, N-phenylmaleimide, and vinylamides, such as N-vinylpyrrolidone, N-vinylcaprolactam and N-methyl-N-vinylacetamide. Preference is given to esters of (meth)acrylic acid, (meth)acrylonitrile, N-substituted acrylamides and substituted or unsubstituted styrenes. Particular preference is given to units containing aromatic groups, such as benzyl (meth)acrylate, benzylmethacrylamide, N-(meth)acryloylaminomethylphthalimide and substituted or unsubstituted styrenes. The term "(meth)acrylic acid" here and below represents "acrylic acid and/or methacrylic acid". The corresponding situation applies to (meth)acrylonitrile, (meth)acrylamide, (meth)acryloyl-, (meth)acrylate, etc.

The weight average molecular weight $M_w$ of the polymer according to the invention is generally from 1000 to 100,000, preferably from 5000 to 50,000, particularly preferably from 10,000 to 30,000 (determined by GPC with reference to a polystyrene standard). The proportion of units of the formula I in the polymer is generally from 10 to 90 mol%, preferably from 25 to 65 mol%, particularly preferably from 30 to 50 mol%.

The further units may also contain reactive groups, as is the case, for example, in N,N'-methylenebismethacrylamide units. They may also contain thermally crosslinkable groups, for example activated groups of the formula —CH$_2$—OR (see EP-A 184 044). Copolymers containing reactive side groups are also obtained using monomers containing epoxide units, in particular glycidyl methacrylate, or monomers containing pendant, masked isocyanate units. The proportion of these reactive monomer units in the polymer according to the invention is up to 5 mol%, preferably from 1 to 4 mol%.

The homopolymerization or copolymerization of the monomers of the formula II can be carried out by methods which are known per se to the person skilled in the art, for example in the presence of a polymerization initiator, such as azobisisobutyronitrile or dibenzoyl peroxide, in organic solvents at elevated temperatures for a period of from 1 to 20 hours. In addition, however, it is also possible to carry out a suspension, emulsion, precipitation or bulk polymerization, which can also be initiated by radiation, heat or ionic initiators.

The invention furthermore relates to a positive- or negative-working, radiation-sensitive mixture which comprises a) a binder which is insoluble in water, but soluble or at least swellable in aqueous-alkaline solution, and b) at least one radiation-sensitive compound, wherein the binder comprises or consists of the polymer according to the invention. The proportion of the polymer according to the invention is from 10 to 95% by weight, preferably from 30 to 80% by weight, in each case based on the total weight of the nonvolatile constituents of the mixture.

Any desired radiation-sensitive compound can be used. The radiation-sensitive compound for positive-working mixtures, which are intended for exposure at a wavelength in the range from 350 to 450 nm, can be a 1,2-quinone diazide compound. Also suitable for this purpose are combinations of compounds which form a strong acid on irradiation, and compounds which contain at least one acid-cleavable C—O—C bond. Mixtures which are intended for exposure to IR radiation in the range from 750 to 1100 nm contain, for example, carbon black as a thermal sensitizer in the case of broad-band sensitization or methine dyes as spectral sensitizers.

For negative-working mixtures, the radiation-sensitive component can be either a diazonium polycondensation product or a free-radical-polymerizable system consisting of photoinitiators and ethylenically unsaturated compounds which are free-radical-polymerizable, or a combination of these components.

Suitable radiation-sensitive components are also positive-working photosemiconductors or a mixture of photosemiconductors and sensitizers.

The 1,2-quinone diazides are preferably 2-diazo-1,2-naphthoquinone-4- or -5-sulfonic esters or -sulfonamides. Of these, preference is in turn given to the esters of 2-diazo-1,2-naphthoquinone-4- or -5-sulfonic acid and 2,5-dihydroxybenzophenone, 2,3,4-trihydroxybenzophenone, 2,3,4-trihydroxy-4'-methylbenzophenone, 2,3,4-trihydroxy-4'-methoxybenzophenone, 2,3,4,4'-tetrahydroxybenzophenone, 2,3,4,2',4'-pentahydroxybenzophenone, 5,5'-dialkanoyl-2,3,4,2',3',4'-hexahydroxydiphenylmethane (especially 5,5'-diacetyl-2,3,4,2',3',4'-hexahydroxydiphenylmethane) or 5,5'-dibenzoyl-2,3,4,2',3',4'-hexahydroxydiphenylmethane. The polyhydroxy compounds here are generally partially esterified. The proportion of 1,2-quinone diazide compound(s) is generally from 3 to 50% by weight, preferably from 7 to 35% by weight, based on the total weight of the nonvolatile constituents of the mixture.

It is also possible to employ the 1,2-quinone diazide compounds in the form of their esters or amides with the polymers according to the invention if the latter contain reactable hydroxyl or amino groups. The esterification/amidation of the corresponding diazo-1,2-quinonesulfonic or carboxylic acids with the hydroxyl and/or amino groups of the parent polymers is carried out by processes known to the person skilled in the art.

Particularly suitable acid-cleavable compounds are

A) those containing at least one orthocarboxylate and/or carboxamide acetal group, where the compounds can also have a polymeric character and said groups can also occur as linking elements in the main chain or as pendant substituents, B) oligomeric and polymeric compounds containing recurring acetal and/or ketal groups in the main chain, and C) compounds containing at least one enol ether or N-acyliminocarbonate group.

Acid-cleavable compounds of type A) as components of radiation-sensitive mixtures are described in detail in EP-A 0 022 571. Mixtures containing compounds of type B) are disclosed in DE-C 23 06 248 and DE-C 27 18 254. Compounds of type C) are disclosed in EP-A 0 006 626 and 0 006 627. The proportion of cleavable compound is generally from 5 to 70% by weight, preferably from 5 to 40% by weight based on the total weight of the non-volatile constituents of the mixture.

Suitable radiation-sensitive components which preferably form or eliminate strong acid on irradiation are a large number of known compounds and mixtures, such as phosphonium, sulfonium and iodonium salts, halogen compounds and organometallic/organohalogen combinations.

The phosphonium, sulfonium and iodonium compounds are generally employed in the form of their salts which are soluble in organic solvents, usually as precipitation product with complex acids, such as tetrafluoroboric acid, hexafluorophosphoric acid, hexafluoroantimonic acid and hexafluoroarsenic acid.

In principle, the halogen-containing, radiation-sensitive compounds which form hydrohalic acid can be all organohalogen compounds which are also known as photochemical free-radical initiators, for example those containing at least one halogen atom on a carbon atom or on an aromatic ring. Of these compounds, preference is given to s-triazine derivatives containing halomethyl groups, in particular trichloromethyl groups, and an aromatic or unsaturated substituent on the triazine ring, as described in DE-C 27 18 259 (=U.S. Pat. No. 4,189,323). 2-Trihalomethyl [1,3,4]oxadiazoles are also suitable. The action of these halogen-containing compounds can also be spectrally modified and augmented by known sensitizers.

The amount of initiator can likewise vary greatly depending on its chemical nature and the composition of the layer. Favorable results are achieved if the proportion of the initiator is from about 0.1 to 10% by weight, preferably from 0.2 to 5% by weight, in each case based on the total weight of the nonvolatile components of the mixture. In particular for copying layers having thicknesses of greater than 0.01 mm, it is advisable to use relatively little acid donor.

In order to achieve sensitization to IR radiation, carbon black dispersions in the polymeric binder described above are suitable. The term IR-sensitive here is taken to mean—as generally usual in the field—that the mixture or layer formed therefrom is sensitive to radiation having a wavelength of from 700 to 1100 nm. Carbon black pigments are therefore particularly suitable as IR-absorbent component, since they absorb over a broad IR wavelength range. However, it is also possible to use other compounds which absorb in the IR region, such as suitably substituted phthalocyanines (e.g. Zeneca PRO-JET 830 or Projet 950 NP) or methine dyes, for the IR sensitization. Mixtures which are sensitive to IR radiation are disclosed in DE-A 197 12 323, DE-A 197 39 302, EP-A 0 625 728 and 0 780 239.

Suitable diazonium polycondensation products are known to the person skilled in the art. They can be prepared in a conventional manner by condensation of a diazo monomer (EP-A 0 152 819) with a condensation agent, such as formaldehyde, acetaldehyde, propionaldehyde, butyraldehyde, isobutyraldehyde or benzaldehyde, or aldehydes containing acidic units, such as para-formyl-benzoic acid. It is furthermore possible to use cocondensates which, in addition to the diazonium compounds, contain other, non-photosensitive units derived from compounds which are capable of undergoing condensation, in particular from aromatic amines, phenols, phenol ethers, aromatic thioethers, aromatic hydrocarbons, aromatic heterocyclic compounds or organic acid amides, which may also be substituted by acidic units. Particularly preferred diazonium polycondensation products are products of the reaction of diphenylamine-4-diazonium salts, which optionally contain a methoxy group in the phenyl radical carrying the diazo group, with formaldehyde or 4,4'-bismethoxymethyldiphenyl ether. Suitable anions of these diazo resins are in particular aromatic sulfonates, such as toluene-4-sulfonate or mesitylenesulfonate. The proportion of diazonium polycondensation product(s) is preferably from 3 to 60% by weight, based on the total weight of the nonvolatile constituents of the photosensitive mixture.

The negative-working, photosensitive component may also be a free-radical-polymerizable system. This is composed of photoinitiators which absorb in the range from 300 to 1100 nm, and free-radical-polymerizable, ethylenically unsaturated constituents. Suitable photoinitiators are, for example, acetophenone, benzophenone, trichloromethyl-1,3,5-triazine, benzoin, benzoin ethers, benzoin ketals, xanthone, thioxanthone, acridine, porphyrin or hexaarylbisimidazole, or derivatives thereof. These photoinitiators can be used in combination with a metallocene, which may be substituted if desired (EP-A 0 364 735). The free-radical-polymerizable constituent is an acrylic or methacrylic acid derivative containing one or more unsaturated groups, preferably esters of (meth)acrylic acid in the form of monomers, oligomers or prepolymers. It can be in solid or liquid form, preference being given to solid and viscous forms. The compounds which are suitable as monomer include, for example, trimethylolpropane tri(meth)acrylate, pentaerythritol hexa(meth)acrylate, dipentaerythritol penta(meth)acrylate, dipentaerythritol hexa(meth)acrylate, pentaerythritol tetra(meth)acrylate, 1,1,1,3,3,3-hexamethylolpropane tetra(meth)acrylate (also known as "ditrimethylolpropane tetra(meth)acrylate"), diethylene glycol di(meth)acrylate, triethylene glycol di(meth)acrylate or tetraethylene glycol di(meth)acrylate. Particularly preferred free-radical-polymerizable, ethylenically unsaturated compounds are acrylates or alkylacrylates containing at least one group which can be photooxidized on exposure in the presence of the initiator, for example an amino, urea, thiol or enol group, and the products of the reaction of triethanolamine or N,N'-(2-hydroxyethyl)piperidine with isocyanatoethyl methacrylate or of triethanolamine and 2,2,4-trimethylhexamethylene diisocyanate with glycidyl acrylate. Suitable oligomers and prepolymers are polyurethanes, epoxy resins or polyesters containing (meth)acrylate groups, and also unsaturated polyester resins.

The proportion of the photoinitiators is preferably from 0.5 to 20% by weight, and the proportion of the free-radical-polymerizable compound is from 5 to 80% by weight, in each case based on the total weight of the nonvolatile constituents of the photosensitive mixture.

A combination of the diazonium polycondensation products with a free-radical-polymerizable system consisting of photoinitiators and ethylenically unsaturated compounds which can be polymerized by means of free radicals can be advantageous for certain applications. Such hybrid systems preferably comprise from 1 to 50% by weight of diazonium polycondensation products, from 0.5 to 20% by weight of photoinitiators and from 5 to 80% by weight of the free-radical-polymerizable compounds, all based upon the total weight of the nonvolatile constituents of the mixture.

The polymers according to the invention are also suitable in electro-photographic layers, as described, for example, in EP-A 0 157 241 and 0 324 180. Photosemiconductors which can be employed are, for example, derivatives of oxadiazole or suitably substituted triphenylenes.

In addition, numerous other oligomers and polymers can also be used, for example phenolic resins of the novolak type or vinyl polymers, such as polyvinyl acetals, poly(meth)acrylates, polyvinyl ethers and polyvinylpyrrolidones, which may themselves have been modified by comonomers.

In order to show imagewise color contrast immediately after exposure, the layers additionally contain a combination of indicator dyes and radiation-sensitive components which form strong acids on exposure, as described above.

The amount of photochemical acid donor can, depending on its chemical nature and the composition of the layer, likewise vary greatly. Suitable results are obtained generally using from about 0.1 to 10% by weight, based on the total weight of the nonvolatile constituents of the layer.

Particularly suitable indicator dyes have proven to be cationic dyes, such as triphenylmethane dyes, in particular in the form of their carbinol bases, and methine dyes.

Furthermore, soluble or finely particulate, dispersible dyes and UV absorbers, surfactants, polyglycol derivatives and pigments can be added to the radiation-sensitive mixture. The most favorable mixing ratios of the components can easily be determined in each individual case by preliminary experiments using the present specification as a guide.

The invention also relates to a radiation-sensitive recording material comprising a layer support and a radiation-sensitive layer including the mixture according to the invention.

In order to coat a suitable layer support, the mixtures are generally dissolved in a solvent. The choice of solvent should be matched to the proposed coating method, the layer thickness and the drying conditions. Suitable solvents for the mixture according to the invention are, in particular, highly polar solvents, such as dimethyl sulfoxide, tetramethylene sulfone (sulfolan), N-methylpyrrolidone, N-hydroxyethylpyrrolidone, N,N-dimethylformamide, N,N-dimethylacetamide, γ-butyrolactone, acetonitrile, butyronitrile, 2-nitropropane, nitromethane, ethylene carbonate and propylene carbonate. These solvents are preferably used in the form of a mixture with ketones (such as acetone or methyl ethyl ketone), chlorinated hydrocarbons (such as trichloroethylene or 1,1,1-trichloroethane), alcohols (such as methanol, ethanol or propanol), ethers (such as tetrahydrofuran), alcohol ethers (such as ethylene glycol monomethyl ether or propylene glycol monomethyl ether) or esters (such as methyl acetate, ethyl acetate, ethylene glycol monomethyl ether acetate or propylene glycol monomethyl ether acetate). In principle, it is possible to use all solvents or solvent mixtures which do not react irreversibly with the layer components.

Layer supports used for layer thicknesses of less than about 10 μm are usually metals. For offset printing plates, bright-rolled, mechanically and/or electrochemically roughened and optionally anodized aluminum is suitable. The support material may in addition have been chemically pretreated, for example with polymers which have units containing phosphonic, carboxylic or sulfonic acid groups and in addition may have units containing basic groups, for example amino groups. Silicates, phosphates, fluorides or fluoro complexes are furthermore suitable for the pretreatment. Combinations of such pretreatments are also possible.

The layer support is coated in a known manner such as, for example, by spin coating, spraying, dipping, rolling, by means of slot dies, knife coaters or by curtain coating.

The exposure can be carried out using conventional light sources, such as tube lamps, xenon pulse lamps, metal-halide-doped mercury vapor high-pressure lamps and carbon arc lamps.

In this description, the terms exposure and irradiation are taken to mean the action of actinic electromagnetic radiation in the wavelength regions below about 1100 nm. All radiation sources which emit in this wavelength region are basically suitable.

Also advantageous is laser irradiation equipment, in particular automatic processing units containing, for example, an argon or krypton ion laser, a frequency-doubled Nd-YAG laser or a laser diode as radiation source.

The irradiation can furthermore be carried out using electron beams. In this case, acid-forming compounds which are not photosensitive in the conventional sense can also be employed as initiators for the solubilization reaction. Examples thereof are halogenated aromatic compounds and halogenated polymeric hydrocarbons. X-rays are also suitable for image generation.

The imagewise-exposed or irradiated layer can be developed in a known manner using virtually the same developers as are known for commercially available layers and resists. The recording materials according to the invention can be matched to specific developers and programmed spray development equipment. The aqueous developer solutions can contain, for example, alkali metal phosphates, silicates or hydroxides and furthermore wetting agents and, if desired, relatively small proportions of organic solvents. In certain cases, solvent/water mixtures can also be used as developer. The choice of the best developer can be determined by experiments with the layer used in each case using the present specification as a guide. If necessary, the development can be supported mechanically.

In order to further strengthen the copying layer, the recording material according to the invention can, after imagewise exposure and developement using an aqueous-alkaline solution—if desired covered with a hydrophilic protective film—be warmed to elevated temperature or subjected to postexposure. In this process, which is known as "setting", the developed recording material is generally warmed to a temperature of from 150 to 280° C. for from 0.5 to 60 minutes.

Examples of preferred embodiments are given below. In the examples, pbw stands for "part(s) by weight". The examples are for illustrative purposes only and do not limit the scope of the invention.

SYNTHESIS EXAMPLE 1 FOR MONOMERS OF THE FORMULA II 1 mol of maleic anhydride was dissolved in 150 ml of solvent. 1 mol of the respective 4-aminobenzenesulfonamide in 800 ml of the solvent was then added dropwise with ice cooling. When the addition was complete, the mixture was stirred at room temperature for one day, and the maleimide acid was then precipitated in water. The maleimide acid was dried in vacuo and then heated at 70° C. for three hours with 900 ml of acetic anhydride and 50 g of sodium acetate. The substituted maleimide was precipitated in water and dried in vacuo. The yield over the two steps was between 80 and 95% of theory. The following were obtained by this procedure:

Monomer 1: 4-maleimidobenzenesulfonamide, prepared from maleic anhydride and sulfanilamide (=4-aminobenzenesulfonamide); (formula II: $R^1=R^2=R^3=R^4=R^5=H$).

$^1$H-NMR (200 MHz; DMSO-$d_6$): 7.25 (s; 2H), 7.65 (d; 2H), 8.05 (d; 2H);

| Elemental analysis: | C: 47.58% | (calc.: 47.57%) |
| --- | --- | --- |
| | H: 3.14% | (calc.: 3.17%) |
| | N: 11.15% | (calc.: 11.10%) |

Monomer 2: N-Thiazol-2-yl-4-maleimidobenzene-sulfonamide, prepared from maleic anhydride and N-(thiazol-2-yl)sulfanilamide (=sulfathiazole); (formula II: $R^1=R^2=R^3=R^4=H$, $R^5$=thiazol-2-yl).

$^1$H-NMR (200 MHz; DMSO-$d_6$): 6.85 (d; 1H), 7.25 (s; 2H), 7.30 (d, 1H), 7.95 (d, 2H);

| Elemental analysis: | C: 46.28% | (calc.: 46.38%) |
|---|---|---|
| | H: 2.75% | (calc.: 2.68%) |
| | N: 12.48% | (calc.: 12.49%) |

Monomer 3: N-(4,6-Dimethylpyrimidin-2-yl)-4-maleimidobenzenesulfonamide, prepared from maleic anhydride and N-(4,6-dimethylpyrimidin-2-yl)sulfanilamide (=sulfadimidine); (formula II: $R^1=R^2=R^3=R^4=H$, $R^5$=4,6-dimethylpyrimidin-2-yl).

$^1$H-NMR (200 MHz; DMSO-$d_6$): 2.30 (s; 6H), 6.75 (s; 1H), 7.25 (s; 2H), 7.55 (d; 2H), 8.10 (d; 2H);

| Elemental analysis: | C: 53.54% | (calc.: 53.58%) |
|---|---|---|
| | H: 3.95% | (calc.: 3.91%) |
| | N: 15.65% | (calc.: 15.63%) |

Monomer 4: N-Acetyl-4-maleimidobenzenesulfonamide, prepared from maleic anhydride and sulfacetamide; (formula II: $R^1=R^2=R^3=R^4=H$, $R^5$ =CO-CH$_3$).

$^1$H-NMR (200 MHz; DMSO-$d_6$):1.95 (s; 3H), 7.25 (s; 2H), 7.65 (d; 2H), 8.00 (d; 2H);

| Elemental analysis: | C: 48.81% | (calc.: 48.93%) |
|---|---|---|
| | H: 3.44% | (calc.: 3.40%) |
| | N: 9.53% | (calc.: 9.51%) |

SYNTHESIS EXAMPLE 2 FOR MONOMERS OF THE FORMULA II 1 mol of maleic anhydride was dissolved in 700 ml of solvent. 1 mol of the particular 4-aminobenzenesulfonamide was added in portions with ice cooling. When the addition was complete, the mixture was stirred at room temperature for one day. 900 ml of acetic anhydride and 50 g of sodium acetate were then added, and the reaction mixture was heated at 45° C. for one hour. The substituted maleimide was precipitated in water and dried in vacuo. The yield over the two steps was between 80 and 95% of theory. The following were obtained by this procedure:

Monomer 5: 4-Maleimido-2,5-dimethoxy-N-methylbenzenesulfonamide, prepared from maleic anhydride and 4-amino-2,5-dimethoxy-N-methylbenzenesulfonamide (formula II $R^1=R^4$=OCH$_3$; $R^2=R^3$=H; $R^5$=CH$_3$)

$^1$H-NMR (400 MHz; DMSO-$d_6$): 3.3 (s; 6H), 3.75 (d; 3H), 7.25 (s; 2H), 7.40 (s,1 H, 7.55 (s,1 H);

| Elemental analysis: | C: 47.74% | (calc.: 47.81%) |
|---|---|---|
| | H: 4.44% | (calc.: 4.29%) |
| | N: 8.65% | (calc.: 8.58%) |

Monomer 6: 4-Maleimidosulfaguanidine, prepared from maleic anhydride and sulfaguanidine (formula II $R^1=R^3=R^2=R^4$=H, $R^5$=CNH-NH$_2$).

$^1$H-NMR (400 MHz; DMSO-$d_6$): 7.25 (s; 2H), 7.65 (d,2H, 8.15 (d, 2H));

| Elemental analysis: | C: 45.20% | (calc.: 44.21%) |
|---|---|---|
| | H: 4.47% | (calc.: 3.40%) |
| | N: 19.13% | (calc.: 19.03%) |

SYNTHESIS EXAMPLE FOR POLYMERS CONTAINING MONOMER UNITS OF THE FORMULA I

The monomers were dissolved in one of the abovementioned highly polar solvents to give a solution having a solids content of 25% by weight. This solution was heated to 80° C. Under an argon blanket, 3 mol%, based on the total monomer composition, of azobisisobutyronitrile were added over the course of 30 minutes. The solutions were held at this temperature for about 7 hours more. Using the monomers in Table 1, the polymers listed in Table 2 were obtained by this procedure.

TABLE 1

| Monomer | Chemical Name |
|---|---|
| 1 | 4-Maleimidobenzenesulfonamide |
| 2 | 4-Maleimido-N-thiazol-2-ylbenzenesulfonamide |
| 3 | N-(4,6-Dimethylpyrimidin-2-yl)-4-maleimidobenzene-sulfonamide |
| 4 | N-Acetyl-4-maleimidobenzenesulfonamide |
| 5 | 4-Maleimido-2,5-dimethoxy-N-methylbenzenesulfonamide |
| 6 | 4-Maleimidosulfaguanidine |
| 7 | N-Phthalimidomethylmethacrylamide |
| 8 | N-(4-Hydroxyphenyl)-methacrylamide |
| 9 | Styrene |
| 10 | Benzyl methacrylate |
| 11 | (2-Hydroxy-phenyl) methacrylate |
| 12 | 4-Acryloylaminobenzenesulfonamide |
| 13 | 4-Hydroxystyrene |
| 14 | N-(3,5-Dimethyl-4-hydroxybenzyl)methacrylamide |
| 15 | N-Phenylmaleimide |

Maleimido = (2,5-Dioxo-2,5-dihydropyrrol-1-yl)

TABLE 2

| Polymer No. | Monomer A | Monomer B | Monomer C |
|---|---|---|---|
| 1 | 1 (50) | 9 (50) | |
| 2 | 2 (50) | 9 (50) | |
| 3 | 3 (50) | 9 (50) | |
| 4 | 4 (50) | 9 (50) | |
| 5 | 1 (40) | 7 (60) | |
| 6 | 2 (50) | 7 (50) | |
| 7 | 2 (40) | 7 (60) | |
| 8 | 3 (60) | 7 (40) | |
| 9 | 4 (60) | 7 (40) | |
| 10 | 4 (60) | 10 (40) | |
| 11 | 3 (50) | 10 (50) | |
| 12 | 1 (60) | 11 (40) | |
| 13 | 3 (60) | 11 (40) | |
| 14 | 5 (60) | 15 (25) | 10 (15) |
| 15 | 6 (60) | 7 (40) | |
| 16 | 3 (60) | 15 (20) | 10 (20) |
| 17 | 5 (70) | 7 (30) | |
| 18 | 4 (70) | 10 (30) | |
| 19C | 8 (100) | according to JP-A2 51-36129 | |
| 20C | 12 (100) | according to EP-A 0 330 239 | |
| 21C | 13 (100) | according to DE-A 38 20 699 | |
| 22C | 14 (100) | according to DE-A 23 22 230 | |
| 23C | 11 (100) | according to JP-A2 50-55406 | |

( . . . ) = Proportion of the monomer in mol % in the starting monomer composition
C = Comparative The mean molecular weight $M_w$ (determined by gel permeation chromatography [GPC] with reference to a polystyrene standard) was in the range from 10,000 to 30,000 for polymers 1 to 13, and the molecular weight $M_n$ was in the range from 3000 to 10,000.

EXAMPLE 1

An aluminum foil with a thickness of 300 μm which had been electrolytically roughened in hydrochloric acid (roughness value 5.0 μm in accordance with DIN 4768), then pickled and anodized in sulfuric acid (oxide weight 3.5 g/m²) and hydrophilized by means of phosphonomethylated polyethyleneimine and with polyvinylphosphonic acid (corresponding to DE 44 23 140) was spin-coated with the following solution:

| | | |
|---|---|---|
| 7.8 | pbw | of binder (cf. Table 2), |
| 3.2 | pbw | of a product of the esterification of 1.5 mol of 2-diazo-1,2-naphthoquinone-5-sulfonyl chloride and 1 mol of 2,3,4-trihydroxybenzophenone, |
| 0.4 | pbw | of 2-diazo-1,2-naphthoquinone-4-sulfonyl chloride, |
| 0.2 | pbw | of Victoria Pure Blue (Color Index No. 44 045), |
| 0.1 | pbw | of a silica gel filler having a mean particle size of 4 μm, and |
| to 100 | pbw | of a solvent mixture comprising tetrahydrofuran, 1-methoxy-propan-2-ol and dimethyl sulfoxide (50:35:15) | and dried at 110° C., then exposed for 100 s using a 5 kW metal-halide lamp at a distance of 110 cm through a test mask containing continuous-tone elements ("BK 02" exposure wedge from Agfa-Gevaert AG) and half-tone elements ("RK 01" exposure wedge from Agfa-Gevaert AG) and developed for 60 s in a developer having the following composition:

| | | |
|---|---|---|
| 0.4 | mol/l | Na₂SiO₃ |
| 10 | g | of sodium benzoate |
| 1 | g | of an ethylene oxide-propylene oxide copolymer having a molecular weight $M_w$ of 1600 |
| to 1 | l | with demineralized water. |

The results are shown in Table 3, where the abbreviations have the following meanings:

| | |
|---|---|
| LW | layer weight in g/m²; |
| PS | photosensitivity assessed from the open step of the continuous-tone step wedge; |
| Rep | reproduction, assessed from the number of fully reproduced 12 fields of the 60-line screen of the test mask; |
| UV | stability to UV ink detergents after the exposed and developed plates had been exposed for 60 seconds in a cell to an alcohol/glycol ether or ester-based UV ink detergent (Zeller & Gmelin W 936 UV detergent) and then assessed gravimetrically for image damage:<br>+ = layer removal less than 10%; weak attack;<br>0 = layer removal between 10 and 30%; moderate attack;<br>− = layer removal greater than 30%, strong attack or complete layer removal |
| TD | thermal crosslinking behavior after a commercially available heat-set glue (RC 99 from Agfa-Gevaert AG) has been burnt in for 8 minutes at 250° C. in a resist drying cabinet and the resistance of the plates to N,N-dimethylformamide to highly polar solvents has been tested:<br>+ = weak or no attack;<br>− = strong attack or complete layer removal. |
| PR | print run: These plates were used in the non-thermally hardened state for print run tests in a sheet-fed offset machine. The detergent used after every 10,000 prints was Zeller & Gmelin W 936 UV ink detergent: |
| LW | layer weight in g/m²; |
| PS | photosensitivity assessed from the open step of the continuous-tone step wedge; |
| Rep | reproduction, assessed from the number of fully reproduced 12 fields of the 60-line screen of the test mask; |
| UV | stability to UV ink detergents after the exposed and developed plates had been exposed for 60 seconds in a cell to an alcohol/glycol ether or ester-based UV ink detergent (Zeller & Gmelin W 936 UV detergent) and then assessed gravimetrically for image damage:<br>+ = more than 70,000 copies,<br>0 = from 20,000 to 70,000 copies,<br>− = less than 20,000 copies. |

TABLE 3

| Example | Polymer | LW | PS | Rep | TD | UV | PR |
|---|---|---|---|---|---|---|---|
| 1-1 | 1 | 1.8 | 4 | 1-12 | + | + | + |
| 1-2 | 2 | 2.0 | 3 | 1-12 | + | + | + |
| 1-3 | 3 | 2.0 | 4 | 1-12 | + | + | + |
| 1-4 | 4 | 1.9 | 6 | 1-12 | + | + | + |
| 1-5 | 5 | 2.3 | 3 | 1-12 | + | + | + |
| 1-6 | 6 | 1.8 | 5 | 1-12 | + | + | + |
| 1-7 | 7 | 2.0 | 5 | 1-12 | + | + | + |
| 1-8 | 8 | 1.8 | 6 | 1-12 | + | + | + |
| 1-9 | 9 | 1.8 | 5 | 1-12 | + | + | + |
| 1-10 | 10 | 1.9 | 6 | 1-12 | + | + | + |
| 1-11 | 11 | 1.8 | 5 | 1-12 | + | + | + |
| 1-12 | 12 | 2.1 | 4 | 1-12 | + | + | + |
| 1-13 | 10 | 2.0 | 6 | 1-12 | + | + | + |
| 1-14 | 14 | 1.8 | 6 | 1-12 | + | + | + |
| 1-15 | 16 | 2.0 | 5 | 1-12 | + | + | + |
| 1-16 | 17 | 2.1 | 5 | 1-12 | + | + | + |
| 1-17C | 23C | 2.1 | 5 | 1-12 | − | − | − |
| 1-18C | 19C | 2.1 | 5 | 1-12 | − | 0 | 0 |
| 1-19C | 20C | 1.8 | 2 | 1-12 | − | + | + |
| 1-20C | 21C | 2.1 | 5 | 1-12 | + | 0 | 0 |
| 1-21C | 22C | 2.1 | 6 | 1-12 | − | − | − |
| 1-22C | PF resin* | 2.2 | 6 | 1-12 | + | − | − |

*here and below denotes "cresol-formaldehyd novolak having a hydroxyl number of 420 in accordance with DIN 53783/53240 and a mean molecular weight by GPC of 6000 (Polystyrene Standard)"

The results show that the copying layers produced using the polymers according to the invention allowed longer print runs than conventional positive copying layers containing novolaks as binder or containing other polyacrylates described as positive binders, that they are stable to UV detergents at the same time as having good photosensitivity, and that they become resistant even to highly polar solvents after thermal post-hardening.

EXAMPLE 2

An aluminum foil with a thickness of 280 μm which had been electrolytically roughened in nitric acid (roughness value 4.5 μm in accordance with DIN 4768), then pickled and anodized in sulfuric acid (oxide weight 3.0 g/m²) and hydrophilized by means of phosphonomethylated polyethyleneimine and with polyvinylphosphonic acid (corresponding to DE 44 23 140) was spin-coated with the following solution:

| | | |
|---|---|---|
| 7.0 | pbw | of binder (see Table 4), |
| 1.8 | pbw | of a product of the esterification of 3.4 mol of 2-diazo-1,2-naphthoquinone-4-sulfonyl chloride and 1 mol of bis(2,3,4-trihydroxy-5-benzoylphenyl)methane, |
| 0.2 | pbw | of 2-(4-styrylphenyl)-4,6-bistrichloromethyl-s-triazine, |

-continued

| | | |
|---|---|---|
| 0.18 pbw | of Victoria Pure Blue (Color Index No. 44 045), | |
| 0.7 pbw | of 4,4'-dihydroxydiphenyl sulfone, | |
| 0.1 pbw | a silica gel filler having a mean particle size of 4 µm, | |
| 0.01 pbw | of a dimethylsiloxane-ethylene oxide-propylene oxide copolymer, and | |
| to 100 pbw | of a solvent mixture comprising tetrahydrofuran and γ-butyrolactone (65:35), | | and dried at 110° C., exposed for 50 s and developed for 60 s with a developer having the following composition:

| | |
|---|---|
| 0.12 mol | $Na_2Si_3O_7$, |
| 0.48 mol | of KOH, |
| 5 g | of sodium pelargonate, |
| 1 g | of nonylphenol polyglycol ether containing 10 ethylene oxide units, |
| 0.1 g | of silicone antifoam (RC31 from Agfa-Gevaert AG) and |
| to 1 l | with demineralized water. |

The layer weight was a uniform 1.9 g/m². The results are shown in Table 4.

TABLE 4

| Example | Polymer | PS | Rep | UV | TD | PR |
|---|---|---|---|---|---|---|
| 2-1 | 2 | 3 | 1-12 | + | + | + |
| 2-2 | 3 | 4 | 1-12 | + | + | + |
| 2-3 | 4 | 6 | 1-12 | + | + | + |
| 2-4 | 15 | 5 | 1-12 | + | + | + |
| 2-5C | 20C | 5 | 1-12 | − | − | − |
| 2-6C | 22C | 6 | 1-12 | − | − | − |
| 2-7C | PF resin | 3 | 1-12 | − | + | − |

EXAMPLE 3

An aluminum foil having a thickness of 400 µm which had been roughened first, mechanically, then electrolytically in hydrochloric acid (roughness value 6.0 µm in accordance with DIN 4768), then pickled and anodized in sulfuric acid (oxide weight 4.0 g/m²), and which had been hydrophilized by means of polyvinylphosphonic acid was spin-coated with the following solution:

| | |
|---|---|
| 6.5 pbw | of binder (cf. Table 5), |
| 2.3 pbw | of a product of the esterification of 3.6 mol of 2-diazo-1,2-naphthoquinone-5-sulfonyl chloride and 1 mol of bis(2,3,4-trihydroxy-5-acetylphenyl)methane, |
| 0.4 pbw | of 2-diazo-1,2-naphthoquinone-4-sulfonyl chloride, |
| 0.5 pbw | of 2,4-dihydroxybenzophenone, |
| 0.09 pbw | of Crystal Violet Base (C.I. 42 555:1), |
| to 100 pbw | of a solvent mixture comprising acetone and N,N-dimethyl-acetamide (70:30) | and dried at 110° C. An anionically stabilized dispersion of a methacrylic acid-methyl methacrylate-ethyl acrylate copolymer having a methacrylic acid content of 6.1% by weight was sprayed electrostatically as matting layer onto this copying layer in accordance with EP-A 0 649 063, to give a dome height of 4 µm, a mean dome diameter of 30 µm and a dome density of about 2000/cm². The plates were exposed as in Example 1 and developed for 60 s with the following developer:

| | |
|---|---|
| 0.12 mol | of $Na_2Si_3O_7$, |
| 0.48 mol | of KOH, |
| 5 g | of sodium pelargonate, |
| 1 g | of nonylphenol polyethylene glycol ether containing about 10 ethylene oxide units, |
| 0.1 g | of silicone antifoam (RC31 from Agfa-Gevaert AG) and |
| to 1 l | with demineralized water. |

The test results are shown in Table 5.

TABLE 5

| Example | Polymer | LW | PS | Rep | UV | TD | PR |
|---|---|---|---|---|---|---|---|
| 3-1 | 1 | 1.8 | 4 | 1-12 | + | + | + |
| 3-2 | 2 | 2.0 | 3 | 1-12 | + | + | + |
| 3-3 | 3 | 1.7 | 4 | 1-12 | + | + | + |
| 3-4 | 4 | 2.1 | 6 | 1-12 | + | + | + |
| 3-5 | 5 | 2.0 | 3 | 1-12 | + | + | + |
| 3-6 | 6 | 1.9 | 5 | 1-12 | + | + | + |
| 3-7 | 7 | 2.0 | 5 | 1-12 | + | + | + |
| 3-8 | 8 | 1.9 | 6 | 1-12 | + | + | + |
| 3-9 | 9 | 1.8 | 5 | 1-12 | + | + | + |
| 3-10 | 10 | 2.1 | 6 | 1-12 | + | + | + |
| 3-11 | 11 | 1.7 | 5 | 1-12 | + | + | + |
| 3-12 | 12 | 2.0 | 4 | 1-12 | + | + | + |
| 3-13 | 13 | 2.2 | 6 | 1-12 | + | + | + |
| 3-14 | 14 | 1.9 | 6 | 1-12 | + | + | + |
| 3-15C | 23C | 2.0 | 5 | 1-12 | − | − | − |
| 3-16C | 19C | 2.0 | 5 | 1-12 | 0 | − | 0 |
| 3-17C | 20C | 1.8 | 5 | 1-12 | + | − | + |
| 3-18C | 21C | 2.0 | 5 | 1-12 | 0 | + | 0 |
| 3-19C | 22C | 2.2 | 6 | 1-12 | − | − | − |
| 3-20C | PF resin | 2.0 | 6 | 1-12 | − | + | − |

EXAMPLE 4

An aluminum plate having a thickness of 300 µm which had been electrolytically roughened in hydrochloric acid (roughness value 6.0 µm in accordance with DIN 4768), anodized in sulfuric acid (oxide weight 4.0 g/m²) and hydrophilized using polyvinylphosphonic acid was spin-coated with the following solution:

| | |
|---|---|
| 4.7 pbw | of binder (see Table 1), |
| 1.9 pbw | of polyacetal made from 2-ethylbutyraldehyde and triethylene glycol, |
| 0.23 pbw | of 2-(4-styrylphenyl)-4,6-bistrichloromethyl-s-triazine, |
| 0.02 pbw | of Crystal Violet and |
| to 100 pbw | of a solvent mixture comprising butan-2-one and γ-butyrolactone (90:10) |

The plates were exposed as described in Example 1 and developed for 30 s in a solution of the following composition:

| | |
|---|---|
| 8.5 pbw | of $Na_2SiO_3 \times 9H_2O$, |
| 0.8 pbw | of NaOH, |
| 1.5 pbw | of $Na_2B_4O_7 \times 12H_2O$ and |
| to 100 pbw | with demineralized water. |

The results are shown in Table 6.

TABLE 6

| Example | Polymer | LW | PS | Rep | UV | TD | PR |
|---|---|---|---|---|---|---|---|
| 4-1 | 1 | 2.2 | 4 | 1-12 | + | + | + |
| 4-2 | 2 | 1.9 | 3 | 1-12 | + | + | + |
| 4-3 | 3 | 1.9 | 4 | 1-12 | + | + | + |
| 4-4 | 4 | 2.1 | 6 | 1-12 | + | + | + |
| 4-5 | 5 | 1.8 | 3 | 1-12 | + | + | + |
| 4-6 | 6 | 2.0 | 5 | 1-12 | + | + | + |
| 4-7 | 7 | 2.1 | 5 | 1-12 | + | + | + |
| 4-8 | 8 | 1.9 | 6 | 1-12 | + | + | + |
| 4-9 | 9 | 1.9 | 5 | 1-12 | + | + | + |
| 4-10 | 10 | 1.8 | 6 | 1-12 | + | + | + |
| 4-11 | 11 | 1.9 | 5 | 1-12 | + | + | + |
| 4-12 | 12 | 2.0 | 4 | 1-12 | + | + | + |
| 4-13 | 13 | 2.1 | 6 | 1-12 | + | + | + |
| 4-14C | 23C | 2.1 | 5 | 1-12 | 0 | – | 0 |
| 4-15C | 19C | 2.0 | 5 | 1-12 | 0 | – | – |
| 4-16C | 20C | 2.0 | 3 | 1-12 | + | – | + |
| 4-17C | 21C | 1.8 | 5 | 1-12 | 0 | + | 0 |
| 4-18C | 22C | 2.1 | 6 | 1-12 | – | – | – |
| 4-19C | PF resin | 2.0 | 6 | 1-12 | – | + | – |

EXAMPLE 5

An aluminum foil having a thickness of 400 μm which had been roughened first mechanically then electrolytically in hydrochloric acid (roughness value 6.0 μm in accordance with DIN 4768), then pickled and anodized in sulfuric acid (oxide weight 4.0 g/m²) and which had been hydrophilized by means of polyvinylphosphonic acid was spin-coated with the following dispersion:

| | |
|---|---|
| 9.7 pbw | of binder (cf. Table 6), |
| 0.8 pbw | of poly(4-hydroxystyrene) having an $M_w$ of from 4000 to 6000 and an $M_n$ of from 2100 to 3100 (® Maruka Lyncur M, type S-2, from Maruzen Petrochemical Co., Ltd.), |
| 8.0 pbw | of carbon black dispersion of the composition given below, |
| 40 pbw | of propylene glycol monomethyl ether, |
| 31 pbw | of acetone and |
| 10.5 pbw | of γ-butyrolactone. |

The carbon black dispersion here consisted of

| | |
|---|---|
| 5.00 pbw | of carbon black (Special Black 250 from Degussa AG), |
| 66.00 pbw | of the binder (30% in γ-butyrolactone), |
| 28.99 pbw | of γ-butyrolactone and |
| 0.01 pbw | of silicone antifoam (RC31 from Agfa-Gevaert AG). |

The thermal imaging was then carried out using a digital half-tone mask in an external drum exposure unit having an IR laser diode strip (emission maximum: 830 nm; power of each individual diode 40 mW, writing speed: 1 m/s; beam width: 10 μm). An irradiation energy of 250 mJ/cm² was used. The plates were developed for 60 s with the following solution:

| | |
|---|---|
| 0.45 mol/l | of $K_2SiO_3$, |
| 10 g | of sodium cumenesulfonate, |
| 1 g | of polyglycol 1000 dicarboxylic acid, |
| 0.1 g to 1 l | of propylenediamine tetraacetate and with demineralized water. |

The residual fogging (RF) of the layer was assessed visually compared with a support which had been delaminated using KP 273 correction agent from Agfa-Gevaert AG (+=no residual fogging,–=residual fogging).

TABLE 7

| Example | Polymer | LW | RF | Rep | UV | TD | PR |
|---|---|---|---|---|---|---|---|
| 5-1 | 1 | 2.2 | + | 2-98 | + | + | + |
| 5-2 | 2 | 1.9 | + | 2-98 | + | + | + |
| 5-3 | 3 | 1.9 | + | 2-98 | + | + | + |
| 5-4 | 4 | 2.0 | + | 2-98 | + | + | + |
| 5-5 | 5 | 1.9 | + | 2-98 | + | + | + |
| 5-6 | 6 | 2.1 | + | 2-98 | + | + | + |
| 5-7 | 7 | 2.1 | + | 2-98 | + | + | + |
| 5-8 | 8 | 1.9 | + | 2-98 | + | + | + |
| 5-9 | 9 | 1.9 | + | 2-98 | + | + | + |
| 5-10 | 10 | 2.0 | + | 2-98 | + | + | + |
| 5-11 | 11 | 1.9 | + | 2-98 | + | + | + |
| 5-12 | 12 | 2.1 | + | 2-98 | + | + | + |
| 5-13 | 13 | 2.0 | + | 2-98 | + | + | + |
| 5-14 | 17 | 2.2 | + | 2-98 | + | + | + |
| 5-15 | 15 | 1.9 | + | 2-98 | + | + | + |
| 5-16 | 16 | 2.0 | + | 2-98 | + | + | + |
| 5-17C | 23C | 2.1 | + | 2-98 | 0 | – | – |
| 5-18C | 19C | 1.9 | + | 2-98 | 0 | – | 0 |
| 5-19C | 20C | 1.9 | – | 2-98 | + | – | + |
| 5-20C | 21C | 2.0 | – | 2-98 | 0 | + | 0 |
| 5-21C | 22C | 2.0 | + | 2-98 | – | – | – |
| 5-22C | PF resin | 2.2 | + | 2-98 | – | + | – |

EXAMPLE 6

An aluminum foil having a thickness of 400 μm which had been electrolytically roughened in nitric acid (roughness value 6.0 μm in accordance with DIN 4768), then pickled and anodized in sulfuric acid (oxide weight 2.0 g/m²) and which had been hydrophilized by means of polyvinylphosphonic acid was spin-coated with the following solution:

| | |
|---|---|
| 62 pbw | of binder (cf. Table 8), |
| 21 pbw | of a diazonium polycondensation product prepared from 1 mol of 3-methoxydiphenylamine-4-diazonium sulfate and 1 mol of 4,4'-bismethoxymethyldiphenyl ether in 85% phosphoric acid, isolated as mesitylene sulfonate, |
| 2.5 pbw | of phosphoric acid, |
| 3 pbw | of Victoria Pure Blue FGA (C.I. Basic Blue 81), |
| 0.7 pbw | of phenylazodiphenylamine in |
| 2570 pbw | of ethylene glycol monomethyl ether and |
| 780 pbw | of γ-butyrolactone, | then exposed for 30 s and developed for 30 s in a cell with the following solution:

| | |
|---|---|
| 5.0 pbw | of sodium octylsulfate, |
| 1.5 pbw | of sodium metasilicate × 5 $H_2O$, |
| 1.0 pbw | of trisodium phosphate × 12 $H_2O$, |
| 0.5 pbw | of disodium hydrogen phosphate × 12 $H_2O$, |
| 92.0 pbw | of demineralized water. |

In the following tables, the abbreviations have the following meanings:

Dev = developability, which was assessed from fogging-free development of the non-image areas (+ = fogging-free development, − = residual fogging/layer residues).
IPRO = stability to isopropanol: the exposed and developed plates were subjected to isopropanol for 60 s in a cell; the image damage was then assessed gravimetrically:
+ = layer removal less than 10%, weak attack;
0 = layer removal between 10 and 30%, moderate attack;
− = layer removal greater than 30%, strong attack or complete layer removal.
PR = + = print run more than 200,000,
o = print run from 150,000 to 200,000,
− = print run less than 150,000.

TABLE 8

| Example | Polymer | LW | Dev | REP | IPRO | PR |
|---|---|---|---|---|---|---|
| 6-1 | 3 | 0.9 | + | 1-12 | + | + |
| 6-2 | 8 | 0.8 | + | 1-12 | + | + |
| 6-3 | 9 | 0.9 | + | 1-12 | + | + |
| 6-4 | 10 | 0.9 | + | 1-12 | + | + |
| 6-5 | 13 | 1.0 | + | 1-12 | + | + |
| 6-6 | 18 | 1.0 | + | 1-12 | + | + |
| 6-7C | 23C | 1.1 | + | 1-12 | 0 | 0 |
| 6-8C | 21C | 1.1 | + | 1-12 | 0 | − |
| 6-9C | 22C | 1.1 | − | 2-12 | 0 | − |
| 6-10C | PVB* | 1.0 | + | 1-12 | 0 | 0 |

*polyvinylbutyral having a molecular weight $M_w$ of about 80,000 which has been functionalized by means of maleic anhydride and contains 71% of vinylbutyral units, 2% of vinyl acetate units and 27% of vinyl alcohol units.

EXAMPLE 7

An aluminum foil having a thickness of 400 µm which had been electrolytically roughened in hydrochloric acid (roughness value 6.0 µm in accordance with DIN 4768), then pickled and anodized in sulfuric acid (oxide weight 3.0 g/m²) and which had been hydrophilized by means of polyvinylphosphonic acid was spin-coated with the following dispersion:

| | |
|---|---|
| 2.84 pbw | of binder (cf. Table 9), |
| 1.40 pbw | of the product of the reaction of 1 mol of triethanolamine with 3 mol of isocyanatoethyl methacrylate, |
| 0.04 pbw | of Orasol Blue (C.I. 50315), |
| 0.04 pbw | of alcohol-soluble eosine (C.I. 45386), |
| 0.03 pbw | of 2,4-bis-trichloromethyl-6-(4-styrylphenyl)-s-triazine and |
| 0.06 pbw | of dicyclopentadienyl-bis-pentafluorophenyltitanium in |
| 11.0 pbw | of butanone, |
| 7.0 pbw | of butyl acetate and |
| 4.0 pbw | of γ-butyrolactone, | dried and coated with a 15% solution of polyvinyl alcohol (12% residual acetyl groups, K value: 4) to give a top layer weight of between 2.5 and 4 g/cm². The resultant printing plate was exposed for 20 seconds using a 2 kW metal-halide lamp at a distance of 110 cm under a "BK 02" exposure wedge from Agfa-Gevaert AG, with a silver film with uniform blackening (density 1.4) and uniform absorption over the effective spectral region having additionally been mounted on the wedge as gray filter. After the exposure, the plate was warmed at 100° C. for one minute. The plate was then developed for 30 s in a developer having the following composition:

| | |
|---|---|
| 120 pbw | of sodium metasilicate × 9 $H_2O$, |
| 2.13 pbw | of strontium chloride, |
| 1.2 pbw | of nonionogenic wetting agent (coconut fatty alcohol polyoxyethylene ether containing about 8 ethylene glycol units) and |
| 0.12 pbw | of antifoam in |
| 4000 pbw | of demineralized water. |

TABLE 9

| Example | Polymer | LW | Dev | Rep | IPRO | PR** |
|---|---|---|---|---|---|---|
| 7-1 | 3 | 0.8 | + | 1-12 | + | + |
| 7-2 | 8 | 0.9 | + | 1-12 | + | + |
| 7-3 | 9 | 1.0 | + | 1-12 | + | + |
| 7-4 | 11 | 0.9 | + | 1-12 | + | + |
| 7-5 | 13 | 1.0 | + | 1-12 | + | + |
| 7-6 | 15 | 1.1 | + | 1-12 | + | + |
| 7-7 | 18 | 0.9 | + | 1-12 | + | + |
| 7-8C | 23C | 1.1 | + | 1-12 | 0 | 0 |
| 7-9C | 20C | 1.2 | − | 3-12 | + | − |
| 7-10C | 22C | 1.1 | − | 2-12 | 0 | − |
| 7-11C | PA* | 1.2 | + | 1-12 | 0 | 0 |

*Terpolymer of methyl methacrylate-ethylacrylate-methacrylic acid in the ratio 60:25:15
**Print run: + = >150,000; 0 = 100,000 to 150,000; − = print run < 100,000.

EXAMPLE 8

An aluminum foil having a thickness of 150 µm which had been roughened using a suspension of ground pumice and anodized in sulfuric acid and which had been hydrophilized by means of polyvinylphosphonic acid was spin-coated with the following solution:

| | |
|---|---|
| 6.5 pbw | of binder (cf. Table 10), |
| 4.0 pbw | of 2,5-bis-(4-diethylaminophenyl)-1,3,4-oxadiazole, |
| 0.02 pbw | of Rhodamine FB (C.I. 45170) and |
| 0.02 pbw | of acriflavin in |
| 45 pbw | of acetone and |
| 45 pbw | of γ-butyrolactone, | dried and then charged to −550 V by means of a corona in the dark using an EA 693 camera from Agfa-Gevaert AG, exposed in projection by means of 8 halogen lamps of 500 W each for 15 seconds in incident light under a positive copying mask ("BK 02" exposure wedge from Agfa-Gevaert AG), the latent charge image produced was toned with the aid of a magnetic brush using a toner/carrier mixture (toner based on a styrene-butyl acrylate copolymer containing fatty acid-based charged control agent and colored with carbon black, mean particle diameter about 10 µm, iron-based carrier having a mean particle size of about 100 µm, mixing ratio 2:98) at a countervoltage of 150 V, and, after heat setting of the black toner at 130° C., delaminated in a delaminator (EG 659 from Agfa-Gevaert AG) at a processing speed of 1.5 m/min (corresponding to a contact time of about 15 s) at 26° C. using the following solution:

| | |
|---|---|
| 10 pbw | of ethanolamine, |
| 10 pbw | of phenylpolyglycol, |

-continued

| | |
|---|---|
| 2 pbw | of dipotassium hydrogenphosphate, |
| 78 pbw | of demineralized water. |

The results in Table 9 result from the following assessment: developability (Dev) from fogging-free delamination of the non-image areas after 5 seconds (+=fogging-free development; −=residual fogging/layer residues) and reproduction (Rep) from uniform surface coverage of the toner image (+=uniform toning; −=streaking or similar defects). The definition of print run corresponds to the details in Table 8.

TABLE 10

| Example | Polymer | Dev | Rep | PR |
|---|---|---|---|---|
| 8-1 | 2 | + | + | + |
| 8-2 | 4 | + | + | + |
| 8-3 | 6 | + | + | + |
| 8-4 | 10 | + | + | + |
| 8-5 | 11 | + | + | + |
| 8-6 | 13 | + | + | + |
| 8-7 | 16 | + | + | + |
| 8-8C | 19C | + | + | 0 |
| 8-9C | 20C | − | − | − |
| 8-10C | 22C | + | − | − |
| 8-11C | PS/MA* | + | + | + |

*alternating copolymer of styrene and maleic anhydride

All documents and publications referred to in this specification are expressly incorporated herein by reference in their entireties.

German priority application 198 03 564.0 filed Jan. 30, 1998 including the specification, claims and abstract, is expressly incorporated herein by reference in its entirety.

What is claimed is:

1. A copolymer comprising 10 to 90 mol % of units of the formula 1

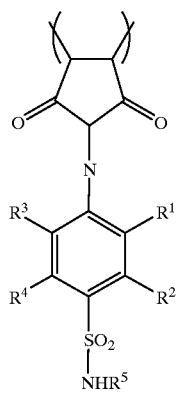

in which
R¹, R², R³, and R⁴ are identical or different and are selected from a hydrogen, a halogen atom, a hydroxyl, an alkoxy group, or an unsubstituted or substituted alkyl or aryl group, and is selected from a hydrogen atom, an alkyl group, an alkanoyl group, a group of the formula C(=NH)—NHR¹, or an iso- or heterocyclic, saturated or unsaturated, unsubstituted or substituted radical having 1 to 20 carbon atoms, which may be linked to one another to form a monocyclic or bicyclic ring system having at least 3 carbon atoms, wherein the thiazolyl group is excluded; and
90 to 10 mol % of one or more additional units.

2. A copolymer as claimed in claim 1, wherein R¹, R², R³ and R⁴ are each a hydrogen atom.

3. A copolymer as claimed in claim 1, wherein the one or more additional units contain aromatic groups.

4. A copolymer as claimed in claim 3, wherein the proportion of units of the formula I in the copolymer is 25 to 65 mol %.

5. A copolymer as claimed in claim 1, having a molecular weight $M_W$ of from 1,000 to 100,000.

6. A copolymer as claimed in claim 1, having a molecular weight $M_W$ of from 5,000 to 50,000.

7. A positive- or negative-working, radiation-sensitive mixture which comprises:
   a) a polymeric binder which is insoluble in water, but soluble or swellable in aqueous-alkaline solutions; and
   b) at least one radiation-sensitive compound,
       wherein the binder comprises a polymer comprising units of the formula I

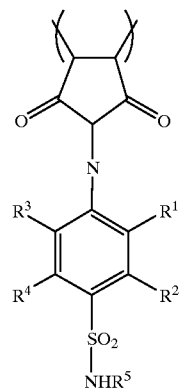

in which
R¹, R², R³, and R⁴ are identical or different and are selected from a hydrogen, a halogen atom, a hydroxyl, an alkoxy group, or an unsubstituted or substituted alkyl or aryl group, and
R⁵ is selected from a hydrogen atom, an alkyl group, an alkanoyl group, a group of the formula C(=NH)—NHR¹, or an iso- or heterocyclic, saturated or unsaturated, unsubstituted or substituted radical having 1 to 20 carbon atoms, which may be linked to one another to form a monocyclic or bicyclic ring system having at least 3 carbon atoms.

8. A mixture as claimed in claim 7, wherein the proportion of the polymer containing units of the formula (I) is from 10 to 95% by weight, based on the total weight of the nonvolatile constituents of the mixture.

9. A mixture as claimed in claim 7, wherein the proportion of the polymer containing units of the formula (I) is from 30 to 80% by weight, based on the total weight of the nonvolatile constituents of the mixture.

10. A mixture as claimed in claim 7, wherein the radiation-sensitive compound comprises a 1,2-quinone diazide compound.

11. A mixture as claimed in claim 7, wherein the radiation-sensitive compound comprises a 2-diazo-1,2-naphthoquinone-4- or -5-sulfonic ester or -sulfonamide.

12. A mixture as claimed in claim 10, wherein the proportion of the 1,2-quinone diazide compound is from 3 to 50% by weight, based on the total weight of the nonvolatile constituents of the mixture.

13. A mixture as claimed in claim 10, wherein the proportion of the 1,2-quinone diazide compound is from 7 to 35% by weight, based on the total weight of the nonvolatile constituents of the mixture.

14. A radiation-sensitive recording material comprising a layer support and a radiation-sensitive layer, wherein the radiation-sensitive layer comprises a mixture as claimed in claim 7.

15. A process for the production of chemical-resistant relief recordings, comprising:

imagewise exposing a radiation-sensitive recording material as claimed in claim 14; and developing the exposed radiation-sensitive recording material with an aqueous-alkaline solution.

16. A copolymer as claimed in claim 3, wherein the units containing aromatic groups are selected from the group consisting of benzyl (meth)acrylate, benzylmethacrylamide, N-(meth)acryloylaminomethylphthalimide, and substituted or unsubstituted styrenes.

17. A copolymer as claimed in claim 1, wherein $R^1$, $R^2$, $R^3$, and $R^4$ are independently selected from the group consisting of a hydrogen atom, a hydroxyl group, and an alkyl group.

18. A copolymer as claimed in claim 1, wherein $R^1$, $R^2$, $R^3$, and $R^4$ are independently selected from a hydrogen atom and a straight-chain or branched $(C_1-C_6)$alkyl group.

* * * * *